(12) United States Patent
Guenther

(10) Patent No.: US 6,888,308 B1
(45) Date of Patent: May 3, 2005

(54) ORGANIC LED DEVICE

(75) Inventor: Ewald Karl Michael Guenther, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/168,055

(22) PCT Filed: Dec. 17, 1999

(86) PCT No.: PCT/SG99/00146
§ 371 (c)(1),
(2), (4) Date: Nov. 15, 2002

(87) PCT Pub. No.: WO01/44866
PCT Pub. Date: Jun. 21, 2001

(51) Int. Cl.[7] ............................ H01J 1/62; H01J 9/26
(52) U.S. Cl. .................... 313/512; 313/504; 445/25
(58) Field of Search ................... 313/498–512, 313/495–497, 582, 587; 445/24, 25

(56) References Cited

U.S. PATENT DOCUMENTS

| | | |
|---|---|---|
| 4,640,584 A | 2/1987 | Tsubakimoto et al. |
| 5,408,109 A | 4/1995 | Heeger et al. |
| 5,482,896 A | 1/1996 | Tang |
| 5,530,269 A | 6/1996 | Tang |
| 5,580,619 A | 12/1996 | Sakai et al. |
| 5,600,203 A * | 2/1997 | Namikawa et al. ......... 313/495 |
| 5,804,917 A | 9/1998 | Takahashi et al. |
| 5,844,363 A | 12/1998 | Gu et al. |
| 5,964,630 A * | 10/1999 | Slusarczuk et al. ........... 445/25 |
| 6,111,355 A * | 8/2000 | Inoue et al. ................. 313/506 |
| 6,169,358 B1 * | 1/2001 | Jones et al. ................. 313/495 |
| 6,198,214 B1 * | 3/2001 | Anandan et al. ............ 313/495 |
| 6,603,254 B1 * | 8/2003 | Ando ........................ 313/495 |

FOREIGN PATENT DOCUMENTS

| | | |
|---|---|---|
| DE | 3716856 A | 12/1987 |
| JP | 58160927 | 9/1983 |
| JP | 04090512 | 3/1992 |
| JP | 04136916 | 5/1992 |
| WO | WO01/04938 | 1/2001 |
| WO | WO01/04963 | 1/2001 |
| WO | WO 01/44865 | 6/2001 |
| WO | WO 01/45140 | 6/2001 |

OTHER PUBLICATIONS

Examination Report, European Patent Office, Application No. 99 962 639.3–2205, Jun. 18, 2004, 4 pp.
Burroughs, J.H. et al., "Light–emitting diodes based on conjugated polymers", Oct. 11, 1990, Nature, London, vol. 347, pp. 539–541.

* cited by examiner

Primary Examiner—Nimeshkumar D. Patel
Assistant Examiner—German Colón
(74) Attorney, Agent, or Firm—Fish & Richardson P.C.

(57) ABSTRACT

The invention provides for the formation of thin devices having an overall thickness which is less than the width of the sealing frame used to mount the cap. The formation of thin devices is facilitated by the use of spacers in the device region to support the cap.

38 Claims, 9 Drawing Sheets

ORGANIC LED DEVICE

This application is a 371 application of PCT/SG99/00146, filed Dec. 17, 1999.

FIELD OF THE INVENTION

The present invention relates to organic LED (OLED) devices. More particularly, the invention relates to packaging of OLED devices.

BACKGROUND OF THE INVENTION

FIG. 1 shows an OLED device 100. The OLED device comprises one or more organic functional layers 110 between first and second electrodes 105 and 115 on a substrate. The electrodes can be patterned to form, for example, a plurality of OLED cells to create a pixelated OLED device. Bond pads 150, which are coupled to the first and second electrodes, are provided to enable electrical connections to the OLED cells. A cap 160 is mounted on the substrate to encapsulate the device. The cap is mounted on a cap sealing frame 135, which typically has a width ($W_{SP}$) of about 0.5–2 mm. Since the active and electrode materials of the OLED cells are sensitive and can be easily damaged from mechanical contact, the cap provides a cavity 145 to prevent the cap from physically contacting the OLED cells. The cavity also allows for the placement of desiccant materials to cope with finite leakage rate of the device. Leakage of oxygen and moisture into the device is a very critical issue since the device degrades rapidly when it is exposed to water or oxygen.

Conventional OLED devices have a thickness ($T_D$) that exceeds the width of the cap sealing frame (e.g., 2–5 mm) However, the demand for thin, lightweight and flexible devices requires the use of thinner components, such as the cap and the substrate. Decreasing the thickness of the cap and substrate reduces the mechanical stability of the device, making it more prone to bending which can cause the cavity to collapse, thereby damaging the OLED cells.

As evidenced from the above discussion, it is desirable to provide a thinner OLED device without sacrificing device reliability.

SUMMARY OF THE INVENTION

The invention relates to fabrication of thin devices. In one embodiment, the invention relates to thin OLED devices. The device comprises a device region in which OLED cells are located. A sealing frame for mounting an encapsulation cap is formed around the device region. In one embodiment spacers are provided in the device region to provide support to the cap. The use of spacers enables the formation of thin devices having an overall thickness which is less than the width of the sealing frame.

PREFERRED EMBODIMENTS OF THE INVENTION

The invention relates generally to OLED devices. In accordance with one embodiment of the invention, an OLED device having a thickness that is less than the width of the cap sealing frame is provided. In another embodiment, the thickness of the OLED device is less than 2 mm, preferably less than 1 mm, and more preferably less than 0.5 mm. Thin devices facilitate the design of lighter and flexible applications, such as portable devices including cellular phones, pagers, personal digital assistants (PDAs) or smart-cards.

In one embodiment of the invention, the OLED device comprises spacer particles or support posts. For purposes of discussion, spacer particles and support posts are referred generally as spacers. The spacers create additional support for the cap in the cavity, preventing it from collapsing onto the OLED cells. This allows the use of thinner substrate and cap to form OLED devices.

Figure 1:
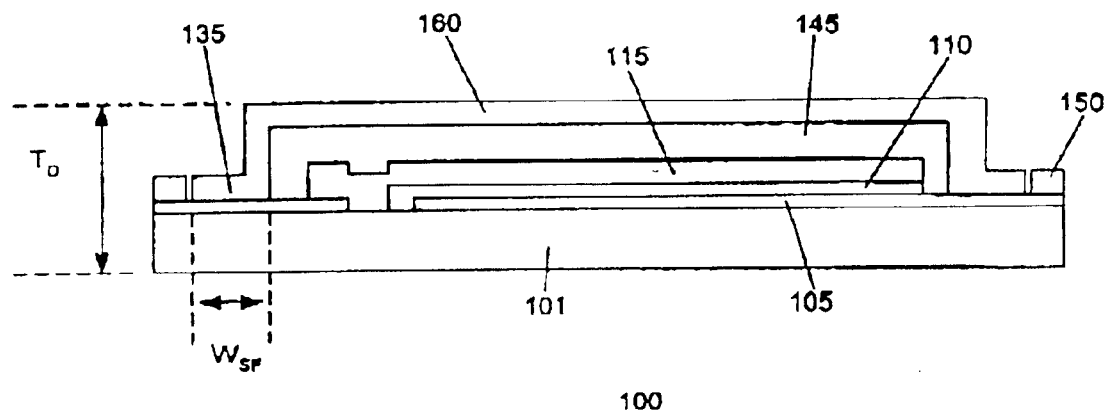
FIG. 1 shows an OLED device.
Figure 2:
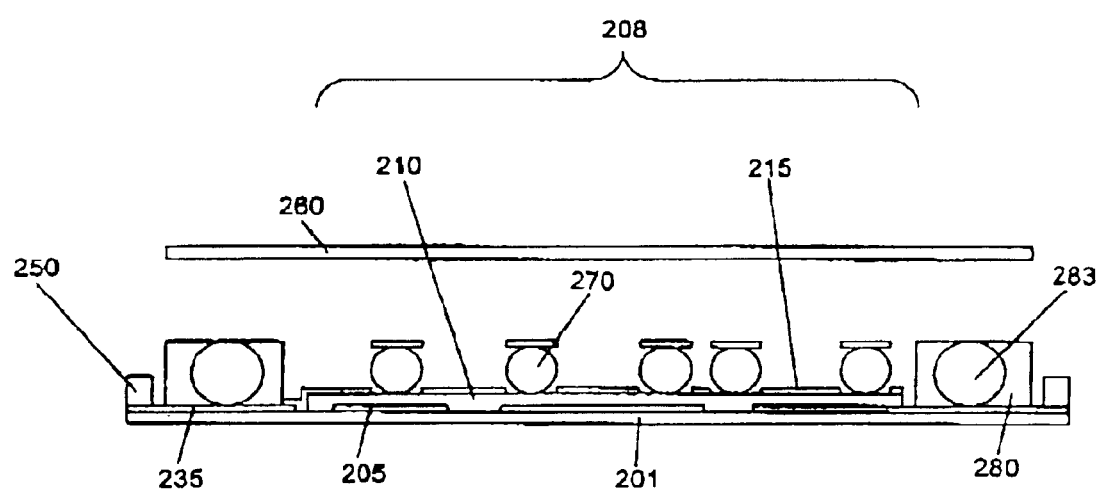
FIGS. 2–3 show a process for forming an OLED device in accordance with one embodiment of the invention.
Figure 3:
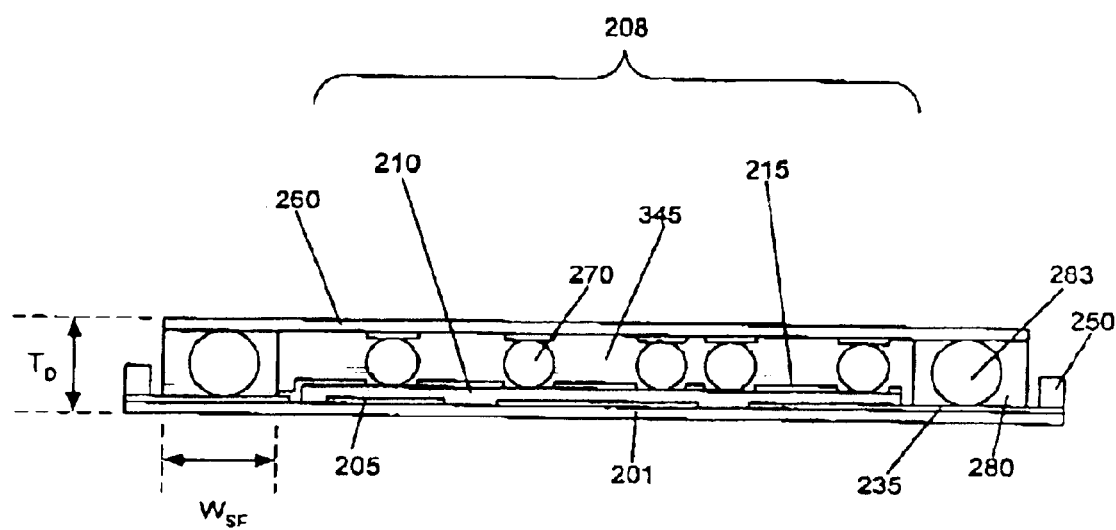

FIGS. 2–3 show a process for fabricating an OLED device in accordance with one embodiment of the invention. Referring to FIG. 2, a thin substrate 201 is provided with OLED cell or cells formed thereon. In one embodiment, the substrate comprises a plastic film such as, for example, transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. A thin substrate comprising glass or other materials, such as a composite stack comprising glass and polymer or polymer films coated with inorganic barrier layers, is also useful.

In one embodiment, the substrate is about 20–300 um thick. In some cases, the thin substrate maybe mechanically unstable, creating processing problems. A temporary support layer (not shown) can be employed to stabilize the substrate during the fabrication process. The temporary support layer, for example, can be provided on the backside of the substrate. In one embodiment, the temporary support layer comprises a polymer foil coated with an adhesive for attaching to the substrate. After processing, the temporary layer is removed since the device package can be used to mechanically stabilize the device.

The OLED cells are formed in the cell region 208 of the substrate. The OLED cells comprise a stack of layers which includes at least one organic functional layer 210 sandwiched between first and second electrodes 205 and 215. Fabrication of OLED cells is described in, for example, Burroughes et al., Nature (London) 347, 539 (1990), which is herein incorporated by reference for all purposes. Bond pads 250 are provided to provide access to the OLED cells. Typically, the total thickness of the OLED stack is about 300–600 nm.

Typically, the fabrication of the OLED cells includes depositing a first electrode layer 205 on the substrate. The first electrode layer comprises, for example, a transparent conductive layer such as indium-tin-oxide. The first electrode layer is patterned using conventional etch and mask techniques. Mechanical patterning techniques, as described in co-pending international application titled "Mechanical Patterning of A Device Layer" (attorney docket number 99E 8062) and which is herein incorporated by reference for all purposes, are also useful. The pattern of the electrode layer depends on the application. For example, the first electrode layer can be patterned to form lower electrode strips which serve as anodes of a pixelated device. Connections to bond pads can also be formed.

One or more organic functional layers are formed on the substrate, covering the first electrodes. The functional organic layers comprise, for example, conjugated polymer or low molecular materials such as $Alq_3$. Other types of functional organic layers are also useful. The organic functional layers can be formed by conventional techniques. Such techniques include, for example, wet processes such as spin coating or vacuum sublimation (for Alq3 organic layers). Portions of the organic functional layers can be selectively removed to expose, for example, the bond pad connections. Selective removal of the organic layers can be achieved using, for example, a polishing process. Other techniques for selective removal of the organic layers, such as etching, scratching, or laser ablation, can also be used.

A second electrode layer is deposited on the substrate over the organic functional layers and patterned. In one embodiment, the second electrode layer is patterned to form second electrode strips which intersect with the first electrode strips to create a pixelated OLED device. Spatially depositing the conductive layer to form second electrodes is also useful. Other techniques for forming OLED cells are also useful.

In one embodiment, spacer particles 270 are deposited in the cell region of the substrate. The spacer particles can be deposited at any point in the process flow prior to encapsulation. For example, the spacers can be deposited before or after the formation of the first or second electrodes. In one embodiment, the spacers are formed in the cell region after the formation of the organic functional layers. Spacer particles are described in concurrently filed international application titled "Encapsulation For Organic LED Device" (attorney docket number GR 99E 2809SG), which is herein incorporated by reference for all purposes.

As shown, the spacer particles comprise a spherical shape. Other geometric shapes, such as cubical, prism, pyramidal, or other regular or irregular shapes, are also useful. The mean diameter of the spacer particles should be sufficient to maintain the desired height of the cavity. Typically, the mean diameter of the spacer particles is about 1–500 $\mu m$. Preferably, the mean diameter of the spacer particles is about 1–20 $\mu m$. The mean diameter of the spacer particles can vary depending on when they are deposited on the substrate during the process flow.

To avoid causing shorts between the electrodes, the spacer particles preferably comprise a non-conductive material. In one embodiment, the spacer particles are made of glass. Spacer particles made of other types of non-conductive materials, such as silica, polymers, or ceramic, are also useful.

The spacer particles are randomly distributed over the cell region, including active and non-active parts of the device (e.g., emitting and non-emitting areas). The distribution or density of the spacer particles should be sufficient to prevent a cap 260 from contacting the OLED cells in the presence of mechanical stress, whether by designed (flexible devices) or accidental (handling of the devices). The distribution can be varied to accommodate design requirements, such as the thickness of the cap, thickness of the substrate and amount of device flexibility needed.

In one embodiment, the spacer distribution is sufficient to maintain the height of the cavity without visibly effecting the emission uniformity of the OLED cells. Typically, a spacer distribution having an average distance between spacer particles of about 10–500 um is adequate in preventing the cap from contacting the OLED cells. Such a distribution along with the small size of the spacer particles ensures that their influence on emission uniformity is essentially invisible to the unaided human eye.

Alternatively, the spacer particles can be selectively located in the device region. The spacer particles, for example, can be selectively deposited in the non-active or non-emissive areas in the device region. Selective deposition of spacer particles is described in concurrently filed international patent application titled "Improved Encapsulation For Organic LED Device" (attorney docket number GR 99E 5160SG) which is herein incorporated by reference for all purposes.

A sealing frame 235 for mounting the cap is prepared. The sealing frame, which surrounds the cell region, is about 0.5–2 mm in width. In one embodiment of the invention, a sealing post 280 is formed in the sealing frame region. The height of the sealing post is sufficient to form a cavity with the desired height. The sealing post, for example, comprises an adhesive for permanently sealing the cap to the device. Adhesives such as uv or thermal curable epoxy, acrylates, hot melt adhesives, or low melt inorganic materials (e.g., solder glass) can be used. Spacer particles 283 can be provided in the sealing post. The spacer particles can be provided in the sealing post to support the cap during the uncured phase of the adhesive in the sealing post. The sealing post is formed using conventional techniques which include, for example, screen-printing, dispensing, or photolithography. Providing adhesives on the inner surface of the cap is also useful. Alternatively, the sealing post can be formed on the inner surface of the cap instead of on the sealing frame.

Referring to FIG. 3, the cap is mounted on the substrate. The cap comprises, for example, a metal or glass. Other types of caps which protect the active components from the environment, such as ceramic or metallized foil caps, are also useful. Typically, the cap is about 20–200 um thick. The sealing post seals the cap, encapsulating the device. The cap forms a cavity 345, supported by spacer particles 270. The resulting device comprises a thickness $(T_o)$<the width of the sealing frame $(W_{sr})$. In one embodiment, the thickness of the device is <1.0 mm. Preferably, the thickness of the device is <0.5 mm.

Figure 4:
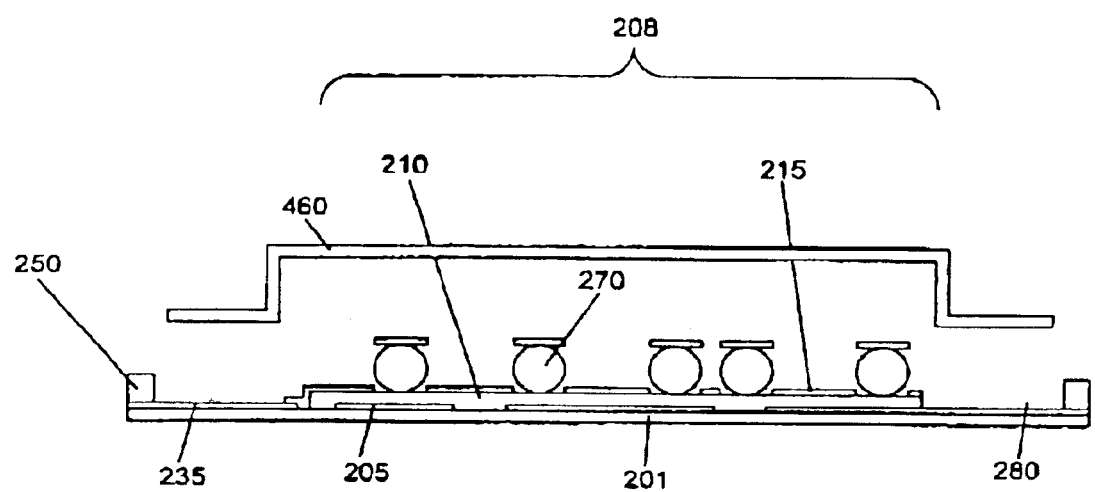
FIGS. 4–5 show a process for forming an OLED device in accordance with another embodiment of the invention.
Figure 5:
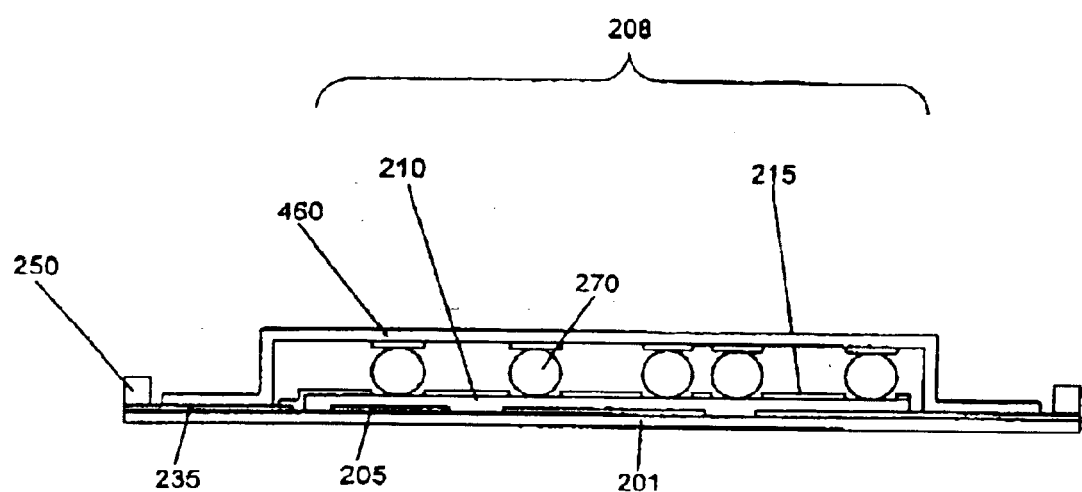

FIGS. 4–5 show an alternative embodiment of the invention. Referring to FIG. 4, a substrate 201 prepared with OLED cells in the cell region 208 is provided. The OLED cells are formed from a stack comprising at least one having organic layer 210 between first and second electrodes 205 and 215. Bond pads 250 which are coupled to the cells can be provided. In accordance with one embodiment of the invention, spacer particles 270 are randomly distributed in the cell region.

A cap sealing frame 235 is prepared for mounting a cap 460 preformed with a cavity. Preparation of the sealing frame includes patterning the substrate, if necessary, to form an area for depositing sealing frame material such as, for example, an adhesive. The preformed cavity cap comprises, for example, metal or glass. Other types of materials which protect the active components from the environment, such as ceramic, are also useful.

Referring to FIG. 5, the preformed cap is mounted on the sealing frame, encapsulating the device. Various techniques can be used to mount the cap. In one embodiment, an adhesive is used to mount the cap. Adhesives such as self-hardening adhesives, UV or thermal curable adhesives, or hot melt adhesives are useful. Other techniques, such as those employing low temperature solder materials, ultrasonic bonding, or welding techniques using inductance or laser welding, are also useful. The spacer particles in the cell region provide additional support for the cap.

Figure 6:
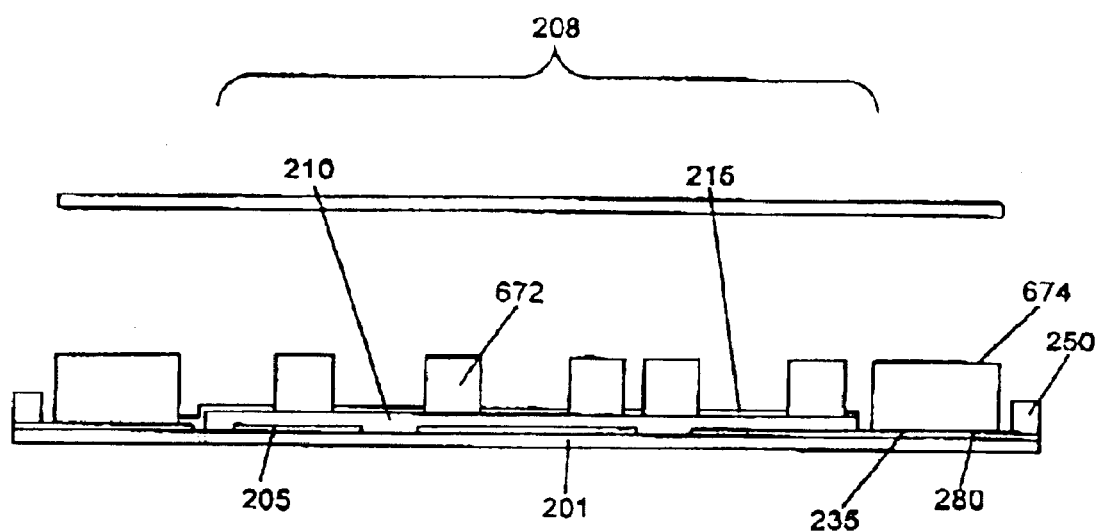
FIGS. 6–7 show a process for forming an OLED device in accordance with another embodiment of the invention.
Figure 7:
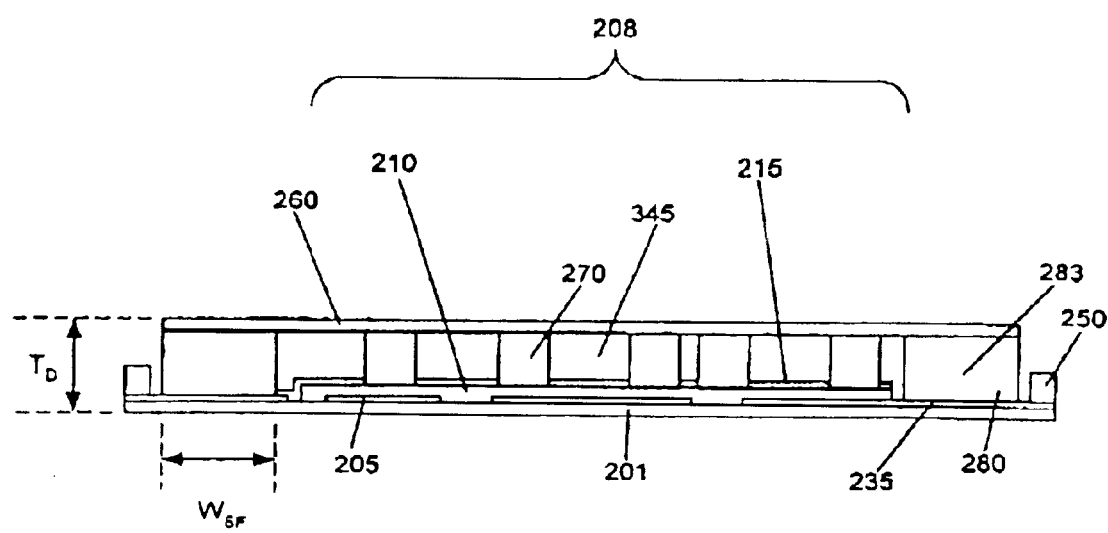

FIGS. 6–7 show a process for forming an OLED device in accordance with another embodiment of the invention. Referring to FIG. 6, a thin substrate 201 of about 20–300 um thick is provided. The substrate may include a temporary support layer (not shown) to provide mechanical stability to the substrate during the fabrication process.

The OLED cells are formed from a stack comprising first and second electrodes 205 and 215 with at least one organic functional layer 210 there between. The electrodes can be patterned to form a pixelated OLED device. Bond pads 250 are provided to provide access to the OLED cells.

In one embodiment, support posts 672 are formed in non-active (non-emissive) portions of the cell region. Support posts 674 can also be formed in the sealing frame region 235 that surrounds the cell region. Support posts are described in co-pending international patent application titled "Encapsulation of A Device (attorney docket number 99E 1975), which is herein incorporated by reference for all purposes.

In one embodiment, the support posts are formed by depositing a spacer layer having the desired thickness on the substrate and patterning it to form support posts in the non-active areas and in the cap sealing frame region. The thickness of the support layer determines the height of the support posts. In one embodiment, the height of the support posts is sufficient to produce a cavity with the desired height. The height of the cavity is, for example, about 1–20 $\mu$m.

In one embodiment, the support posts comprises a dielectric material to electrically isolate the active areas. The dielectric material can either be directly or indirectly patternable. Directly patternable materials include, for example, photopatternable or photosensitive materials such as photosensitive polyimide, photosensitive polybenzoxazole, photoresists, photoresists based on novolac systems, and dry film resist materials. Photoresists based on novolac systems are paticularly useful since they can be cured and crosslinked to provide improved mechanical integrity over other types of non-curable resists. Indirectly patternable materials include, for example, spin-on glass materials, polyimide, polybenzoxazole, polyglutarimide, benzocyclobutene, polymers such as polyethylene (PE), polystyrene (PS), polypropylene (PP), or inorganic materials such as $SiO_2$, $Si_3N_4$, and $AL_2O_3$.

The support posts can be formed at various stages of the process flow. For example, the support posts can be formed before or after the formation of the first or second electrodes. In one embodiment, the support posts are formed after the formation of the first electrode.

Referring to FIG. 7, the cap is mounted on the substrate to encapsulate the device. In one embodiment, the cap comprises metal or glass. Other types of caps which protect the active components from the environment, such as ceramic or metallized foil caps, are also useful. The thickness of the cap is about 20–200 um. The cap can be mounted using, for example, an adhesive. The adhesive can be placed on the support posts or on in inner surface of the cap. Adhesives, such as self-hardening adhesives, UV or thermal curable adhesives, or hot melt adhesives, are useful to mount the cap. Other techniques, such as those employing low temperature solder materials, ultrasonic bonding, or welding techniques using inductance or laser welding, are also useful. The cap forms a cavity 345, supported by support posts.

In an alternative embodiment, a sealing post (as described in FIG. 3) is used to mount the cap. The sealing post, which comprises an adhesive with or without spacer particles, can be formed either in the sealing frame region 235 or on the inner surface of the cap. For applications employing a sealing post, support post 674 is not formed in the sealing frame region.

Figure 8:
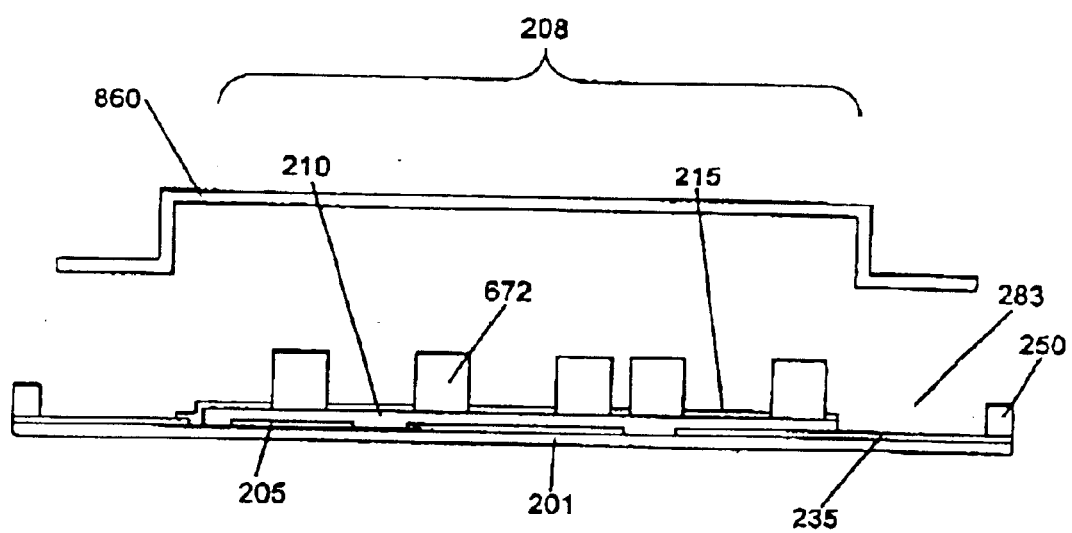
FIGS. 8–9 show a process for forming an OLED device in accordance with another embodiment of the invention.
Figure 9:
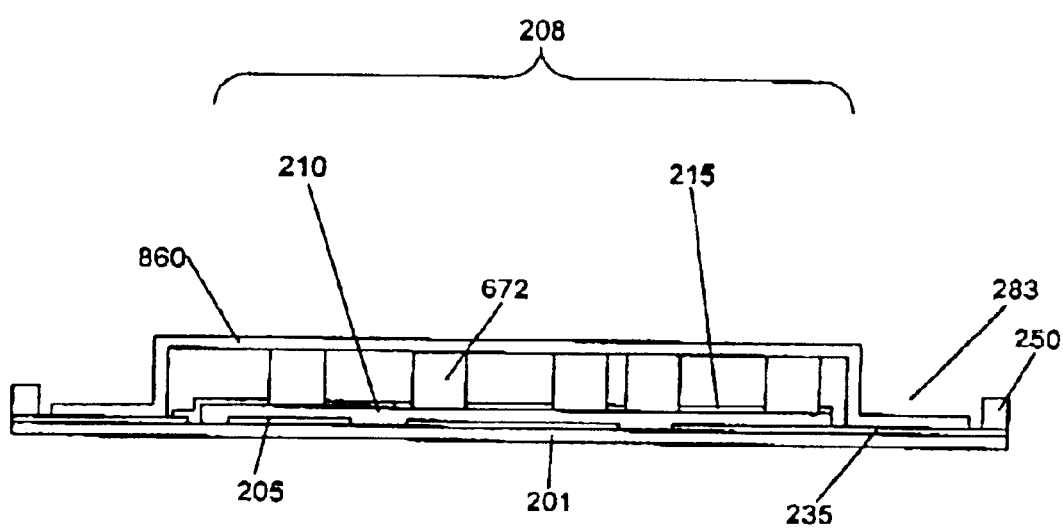

FIGS. 8–9 show anther embodiment of the invention. Referring to FIG. 8, OLED cells are formed in the cell region of a thin substrate with support posts 672 in the non-active areas (as described in FIG. 6). A cap sealing frame 235 is prepared for mounting of a preformed cavity cap 860. The preformed cap comprises, for example, metal or glass. Other types of materials which protect the active components from the environment, such as ceramic, are also useful.

Referring to FIG. 9, the preformed cap 860 is mounted on the sealing frame, encapsulating the device. Various techniques can be used to mount the cap. In one embodiment, an adhesive is used to mount the cap. Adhesives such as self-hardening adhesives, UV or thermal curable adhesives, or hot melt adhesives are useful. Adhesives can also be placed on the support posts 672. Other techniques, such as those employing low temperature solder materials, ultrasonic bonding, or welding techniques using inductance or laser welding, are also useful. The support posts in the cell region provide additional support for the cap.

In alternative embodiments, the spacers can be formed or deposited on the inner surface of the cap. The spacers can be formed in the portions of the inner surface of the cap that corresponds with the cell region on the substrate, for example, to accommodate, for example, the sealing post.

Spacers can also be useful in providing support in other types of devices that employ cavity packages. Such devices include, for example, electrical devices, mechanical devices, electromechanical devices, or microelectromechanical systems (MEMS).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
    a substrate with a device region, wherein the device region includes an organic light emitting diode having at least one organic layer;
    a sealing frame surrounding the device region;
    a cap mounted on the sealing frame to encapsulate the device region, the cap creating a cavity over the device region; and
    spacers located in the device region to support the cap;
    wherein a thickness of the device ($T_P$) is less than a width of the sealing frame ($W_{SF}$).

2. The device of claim 1 wherein the $W_{SF}$ is about 0.5–2 mm.

3. The device of claim 2 wherein the substrate comprises a thickness of about 20–300 um.

4. The device of claim 1, wherein the spacers comprise support posts.

5. The device of claim 4 wherein the support posts are located in non-active areas of the device region.

6. The device of claim 5 wherein the support posts comprise a non-conductive material.

7. The device of claim 4 wherein the support posts comprise a non-conductive material.

8. The device of claim 1, wherein the spacers comprise spacer particles.

9. The device of claim 8 wherein the spacer particles are randomly distributed in the device region.

10. The device of claim 9 wherein the spacer particles comprise a non-conductive material.

11. The device of claim 10 wherein the spacer particles comprise a mean diameter to maintain a height of the cavity between the cap and the substrate.

12. The device of claim 9 wherein the spacer particles comprise a mean diameter to maintain a height of the cavity between the cap and the substrate.

13. The device of claim 8 wherein the spacer particles are selectively located distributed in the device region.

14. The device of claim 13 wherein the spacer particles comprise a mean diameter to maintain a height of the cavity between the cap and the substrate.

15. The device of claim 13 wherein the spacer particles are selectively located in non-active areas of the device region.

16. The device of claim 15 wherein the spacer particles comprise a non-conductive material.

17. The device of claim 16 wherein the spacer particles comprise a mean diameter to maintain a height of the cavity between the cap and the substrate.

18. A device of claim 15 wherein the spacer particles comprise a mean diameter to maintain a height of the cavity between the cap and the substrate.

19. A device comprising:
a substrate with a device region, wherein the device region includes an organic light emitting diode having at least one organic layer;
a sealing frame surrounding the device region;
a cap mounted on the sealing frame to encapsulate the device region, the cap creating a cavity over the device region; and
spacers located in the device region to support the cap;
wherein a thickness of the device ($T_P$) is less than a width of a sealing frame ($W_{SF}$) and the $W_{SF}$ is less than 2 mm.

20. The device of claim 19 wherein the substrate comprises a thickness of about 20–300 um.

21. The device of claim 19 wherein the $W_{SF}$ is less than 1 mm.

22. The device of claim 21 wherein the substrate comprises a thickness of about 20–300 um.

23. The device of claim 19 wherein the $W_{SF}$ is less than 0.5 mm.

24. The device of claim 23 wherein the substrate comprises a thickness of about 20–300 um.

25. A device comprising:
a substrate with a device region;
a sealing frame surrounding the device region;
a cap mounted on the sealing frame to encapsulate the device region, the cap creating a cavity over the device region; and
spacers located in the device region to support the cap;
wherein a thickness of the device ($T_P$) is less than a width of a sealing frame ($W_{SF}$) and the $W_{SF}$ is less than 2 mm.

26. The device of claim 25 wherein the substrate comprises a thickness of about 20–300 um.

27. The device of claim 25 wherein the $W_{SF}$ less than 1 mm.

28. The device of claim 27 wherein the substrate comprises a thickness of about 20–300 um.

29. The device of claim 25 wherein the $W_{SF}$ is less than 0.5 mm.

30. The device of claim 29 wherein the substrate comprises a thickness of about 20–300 um.

31. The device of claim 25 wherein the $W_{SF}$ is about 0.5–2 mm.

32. The device of claim 31 wherein the substrate comprises a thickness of about 20–300 um.

33. A method of forming a device, comprising:
providing a substrate;
forming at least one light emitting cell in a cell region on the substrate, wherein the at least one light emitting cell includes at least one electrode and at least one organic functional layer;
depositing spacer particles onto the substrate;
forming a sealing frame on the substrate, such that the sealing frame surrounds the cell region; and
mounting a cap on the substrate to encapsulate the cell region such that the sealing frame is between the substrate and the cap and the cap forms a cavity in the cell region;
wherein a thickness of the cap, the substrate and the cavity is less than a width of the sealing frame.

34. The method of claim 33, wherein:
forming the sealing frame includes forming a frame that is less than 2 mm in width.

35. The method of claim 34, wherein:
providing a substrate includes providing a substrate that is between about 20 and about 300 microns thick.

36. The method of claim 33, wherein:
forming the sealing frame on the substrate forms the sealing frame in a sealing area; and
depositing the spacer particles includes depositing the spacer particles in the sealing area.

37. The method of claim 33, wherein:
forming the sealing frame includes forming the sealing frame of an adhesive.

38. The method of claim 37, wherein:
forming the sealing frame of an adhesive includes forming the sealing frame of an adhesive from the group consisting of a UV curable epoxy, a thermal curable epoxy, an acrylate and a hot melt adhesive.

* * * * *

UNITED STATES PATENT AND TRADEMARK OFFICE
CERTIFICATE OF CORRECTION

PATENT NO. : 6,888,308 B1
DATED : May 3, 2005
INVENTOR(S) : Ewald Karl Michael Guenther It is certified that error appears in the above-identified patent and that said Letters Patent is hereby corrected as shown below:

Column 7,
Line 32, please replace "A" with -- The --.

Signed and Sealed this

Twenty-seventh Day of September, 2005

JON W. DUDAS
*Director of the United States Patent and Trademark Office*